United States Patent
Foo

(10) Patent No.: US 9,347,129 B2
(45) Date of Patent: May 24, 2016

(54) INTERCHANGEABLE MAGNET PACK

(75) Inventor: Toon Hai Foo, Singapore (SG)

(73) Assignee: Seagate Technology LLC, Cupertino, CA (US)

(*) Notice: Subject to any disclaimer, the term of this patent is extended or adjusted under 35 U.S.C. 154(b) by 105 days.

(21) Appl. No.: 13/316,358

(22) Filed: Dec. 9, 2011

(65) Prior Publication Data
US 2013/0146453 A1 Jun. 13, 2013

(51) Int. Cl.
| C23C 14/00 | (2006.01) |
| C25B 11/00 | (2006.01) |
| C25B 13/00 | (2006.01) |
| C23C 14/34 | (2006.01) |
| C23C 14/35 | (2006.01) |
| H01F 7/02 | (2006.01) |
| H01J 37/34 | (2006.01) |

(52) U.S. Cl.
CPC ............ C23C 14/3407 (2013.01); C23C 14/35 (2013.01); H01F 7/0284 (2013.01); H01J 37/3452 (2013.01); H01J 37/3455 (2013.01); *Y10T 29/49826* (2015.01); *Y10T 29/49947* (2015.01)

(58) Field of Classification Search
CPC ... H01J 37/3405; H01J 37/3452; C23C 14/35
USPC ................................................... 204/298.17
See application file for complete search history.

(56) References Cited

U.S. PATENT DOCUMENTS

| 4,810,346 A | 3/1989 | Wolf et al. |
| 5,181,020 A | 1/1993 | Furukawa et al. |
| 5,407,551 A | 4/1995 | Sieck et al. |
| 6,132,576 A * | 10/2000 | Pearson .................... 204/298.2 |
| 6,287,435 B1 | 9/2001 | Drewery et al. |
| 6,719,886 B2 | 4/2004 | Drewery et al. |
| 7,183,766 B2 | 2/2007 | Ito et al. |
| 2001/0009224 A1* | 7/2001 | Han et al. ................... 204/298.2 |
| 2001/0045353 A1* | 11/2001 | Hieronymi et al. ...... 204/192.12 |
| 2002/0148725 A1* | 10/2002 | Subramani et al. ...... 204/298.19 |
| 2005/0051424 A1 | 3/2005 | Fu et al. |
| 2010/0101602 A1* | 4/2010 | Deehan et al. ................. 134/1.1 |
| 2011/0056829 A1* | 3/2011 | Morimoto et al. ........ 204/298.16 |
| 2012/0097534 A1* | 4/2012 | Takahashi ........... C23C 14/3407 204/298.12 |

FOREIGN PATENT DOCUMENTS

| EP | 1875484 B1 | 5/2011 | |
| JP | WO 2010023952 A1 * | 3/2010 | .......... C23C 14/3407 |
| KR | 1020070102497 A | 10/2007 | |
| WO | WO 2006114229 A1 * | 11/2006 | ............. H01J 37/34 |

OTHER PUBLICATIONS

Machne Translation of WO 2006/114229 A1.*
PCT International Search Report for PCT/US2012/068635, Mar. 21, 2013.

* cited by examiner

*Primary Examiner* — Ibrahime A Abraham

(57) ABSTRACT

A sputtering apparatus includes a template having cells. Removable inserts are disposed within the cells. The cells may be circular, triangular, square, diamond shaped, or hex shaped. The removable inserts may be magnetic or non-magnetic inserts. A cover is connected with a first side of the template. A yoke is connected with a second side of the template. The removable inserts are operable to customize or shape a magnetic field over a target. The yoke is operable to provide a return path for the magnetic field.

19 Claims, 8 Drawing Sheets

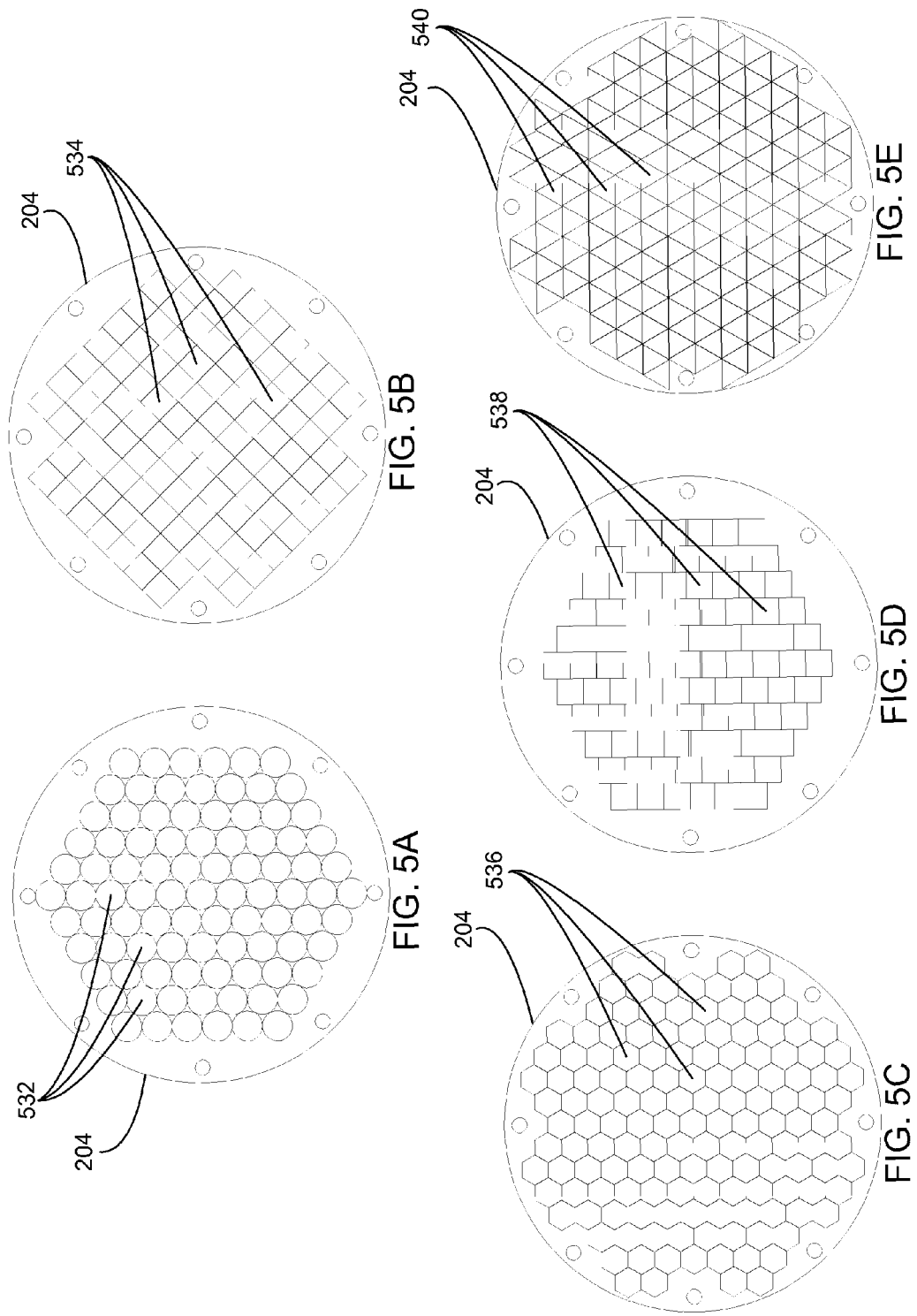

INTERCHANGEABLE MAGNET PACK

FIELD

Embodiments according to the present invention generally relate to sputtering equipment.

BACKGROUND

Generally, sputtering is a process carried out in a vacuum chamber that is filled with selected gasses. The sputtering process causes a substrate to be coated with a material from a target located within a sputtering chamber. As is known, electrons in the chamber strike and ionize an inert gas, forming positive ions. The positive ions are then attracted to the negative target. When the ions strike the target, the ions transfer energy to the target material, causing material from the target surface to eject. Some of the ejected material adheres to and coats the surface of the substrate, commonly positioned opposite the target.

Conventional magnet packs are typically designed for 8", 7", 6.5" and 6" targets. For targets less than 6", the amount of precious metal being sputtered is typically greater than required by the size of the substrate. Conventional magnet packs also limit the potential to reduce sputter redeposition, which may cause large particle, flaking, arching and other associated issues.

BRIEF DESCRIPTION OF THE DRAWINGS

Embodiments of the present invention are illustrated by way of example, and not by way of limitation, in the figures of the accompanying drawings.

FIG. 5A depicts an exemplary template having a plurality of circular cells, according to an embodiment of the present invention.

FIG. 5B depicts an exemplary template having a plurality of diamond shaped cells, according to an embodiment of the present invention.

FIG. 5C depicts an exemplary template having a plurality of hex shaped cells, according to an embodiment of the present invention.

FIG. 5D depicts an exemplary template having a plurality of square shaped cells, according to an embodiment of the present invention.

FIG. 5E depicts an exemplary template having a plurality of triangular shaped cells, according to an embodiment of the present invention.

DETAILED DESCRIPTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Embodiments of the present invention relate to a programmable magnet pack for use in sputtering. The programmable magnet pack includes a cover, a yoke, and a template having a number of cells. A number of removable magnetic inserts and a number of removable non-magnetic inserts are disposed within the cells on the template. The removable inserts may be rearranged to customize or shape predetermined magnetic fields. Thus the magnetic fields may be modified to alter sputtering characteristics. The yoke provides a return path advantageous for the magnetic field generated by the arrangement of inserts on the template. The cover protects the various inserts disposed within the cells on the template from damage and also allows for the inserts to come as close to possible to a sputtering target. The cells and inserts may be fashioned in any closed form shape.

Figure 1:
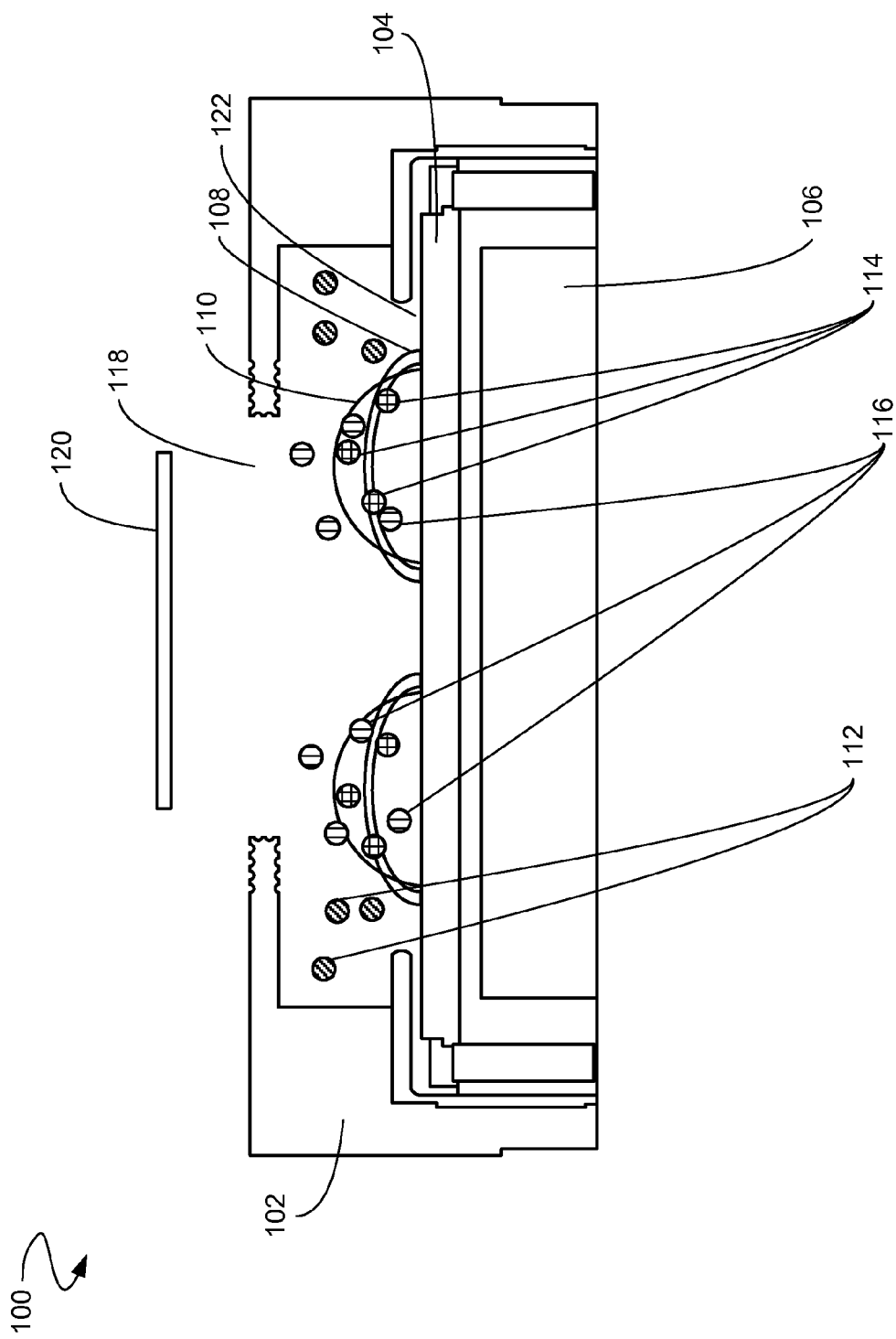
FIG. 1 is a cross section of a sputtering apparatus with a programmable magnet pack, according to an embodiment of the present invention.

FIG. 1 is a cross section of an exemplary sputtering apparatus 100 with a programmable magnet pack 106, according to an embodiment of the present invention. In some embodiments, a shield 102 may direct the flow of gas over the surface of a target 104. In various embodiments the shield 102 may be a redeposition shield, which reduces redeposition material from falling back on the surface of the target 104.

The target 104 overlies the programmable magnet pack 106. The programmable magnet pack 106 creates magnetic fields 108 overlying the target 104 and surrounding a plurality of cells 208 (see FIG. 2). Plasma 110 is confined by the magnetic fields 108. Electrons 112 strike atoms within the plasma 110, forming ions 114. In an embodiment, the ions 114 may be positively charged ions. In embodiments of the present invention, the programmable magnet pack 106 may be configured (see below) to customize or shape the magnetic fields 108 into predetermined and desired forms. As a result, the sputtering characteristics of the sputtering apparatus 100 may be selectively altered.

The ions 114 are attracted towards the target 104. The ions 114 strike the surface of the target 104, releasing target material 116 from the target 104. The shield 102 directs the target material 116 through an aperture 118 and onto a substrate 120. In various embodiments, a reactive gas (not shown), e.g. oxygen, is added within the sputtering apparatus 100. The reactive gas may combine with the target material 116 before collecting on the substrate 120. The target material 116 collects on the substrate 120, forming a thin film (not shown). Thus, the substrate 120 overlies the aperture 118. In some embodiments, the diameter of the aperture 118 is greater than or equal to the diameter of the substrate 120.

Figure 2:
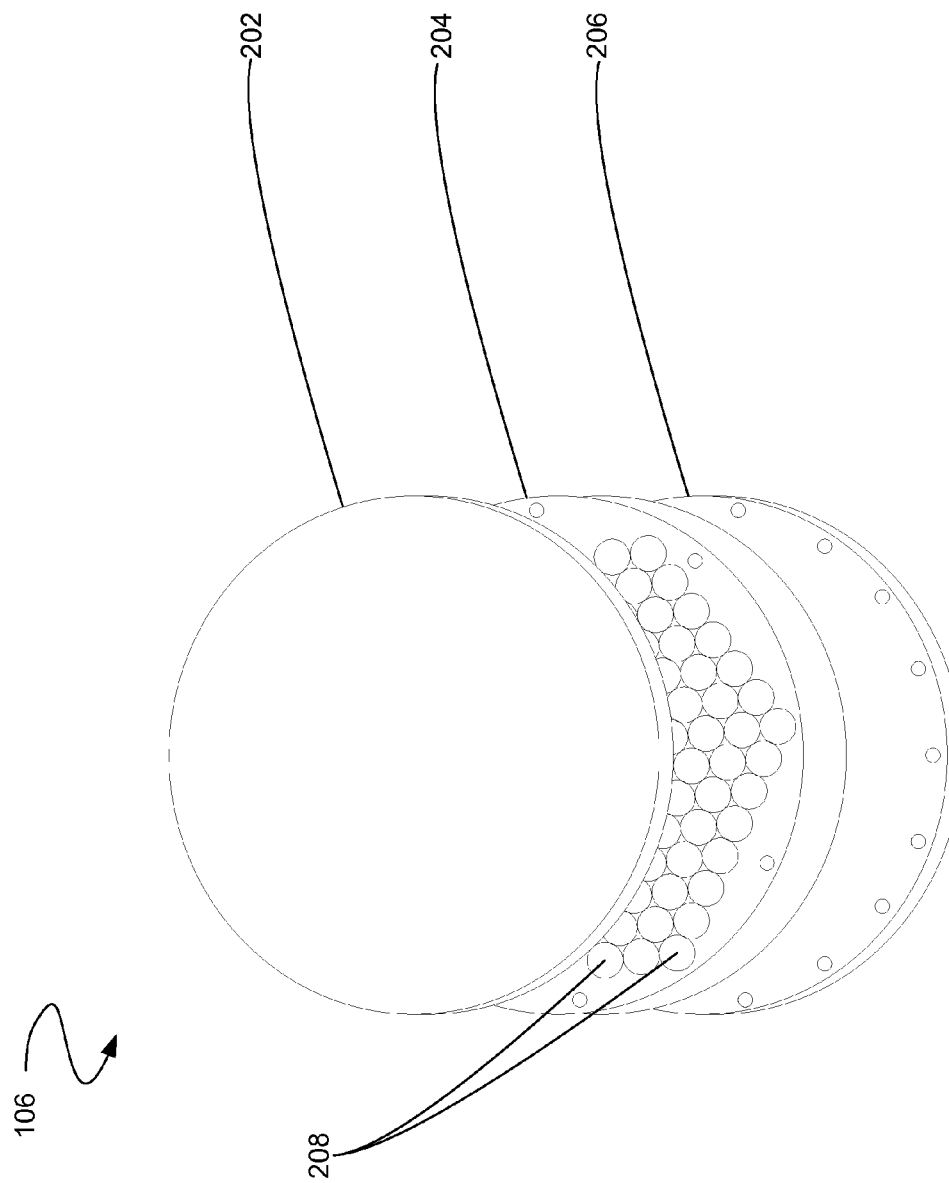
FIG. 2 is a perspective view of an exemplary programmable magnet pack, according to an embodiment of the present invention.

FIG. 2 is a perspective view of the programmable magnet pack 106, according to an embodiment of the present invention. In an embodiment, the main assembly stack of the programmable magnet pack 106 consists of a cover 202, a template 204, and a yoke 206.

Figure 4A:
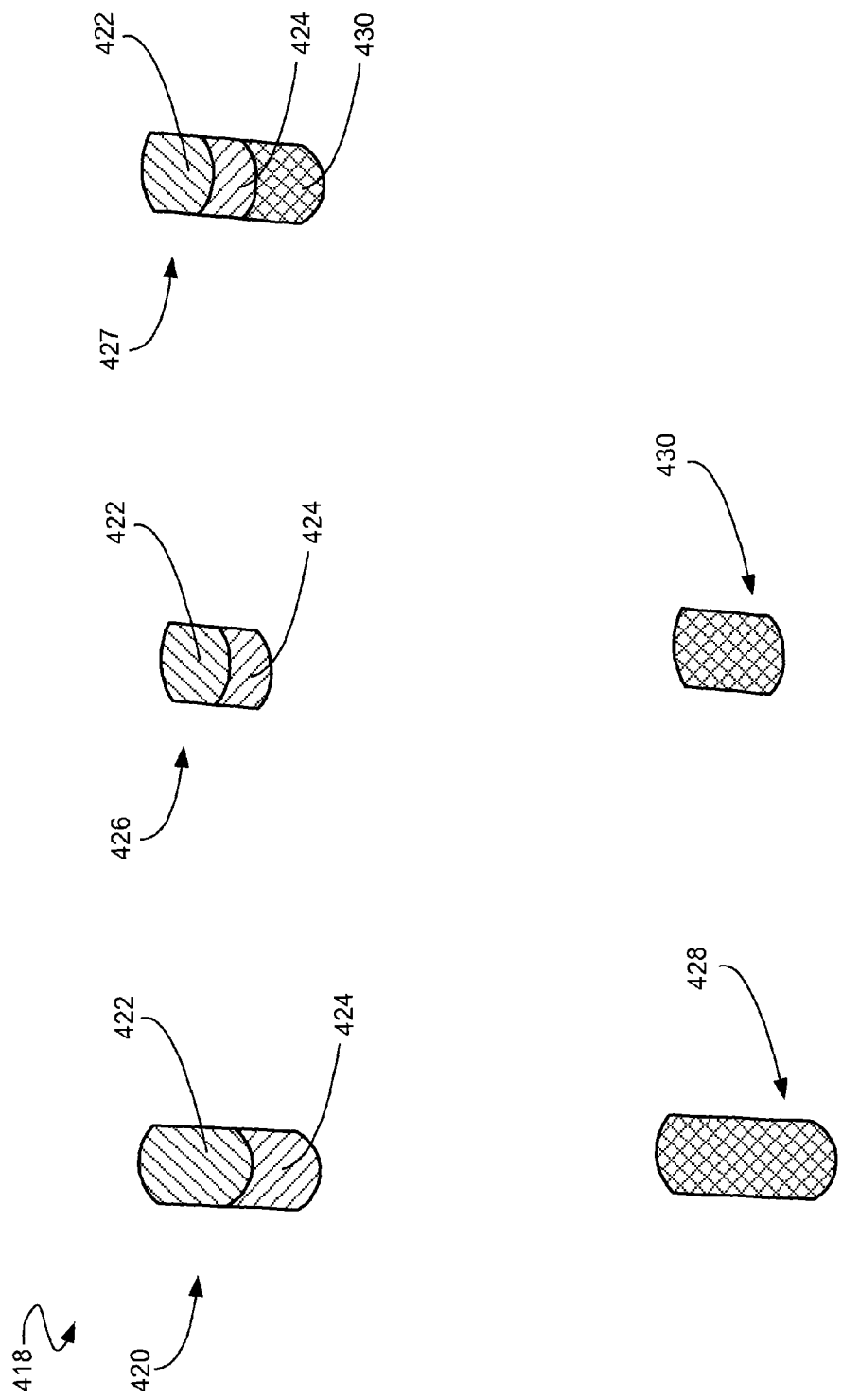
FIG. 4A is a perspective view of various inserts that may be used with a programmable magnet pack, according to an embodiment of the present invention.

The template 204 may include cells 208 that allow for the insertion of various removable and interchangeable inserts 418 (see FIG. 4A). In some embodiments, the template 204 may comprise such materials as, but is not limited to, Aluminum Grade 6061, Copper, or Stainless Steel Grade 300+.

The cover 202 protects the various removable and interchangeable inserts 418 (see FIG. 4A) within the cells 208 on the template 204 from damage and also allows for the various removable and interchangeable inserts 418 (see FIG. 4A) to come as close to the target 104 (FIG. 1) as possible. In an embodiment, the cover 202 may comprise such materials as, but is not limited to, Aluminum Grade 6061, Copper, or Stainless Steel Grade 300+.

The yoke 206 provides a return path for a magnetic field that is customized or shaped by the various removable and interchangeable inserts 418 (see FIG. 4A) within the cells 208 on the template 204. In various embodiments, the yoke 206 may comprise such materials as, but is not limited to, Stainless Steel Grade 538, Stainless Steel Grade 400+, or Steel.

Figure 3:
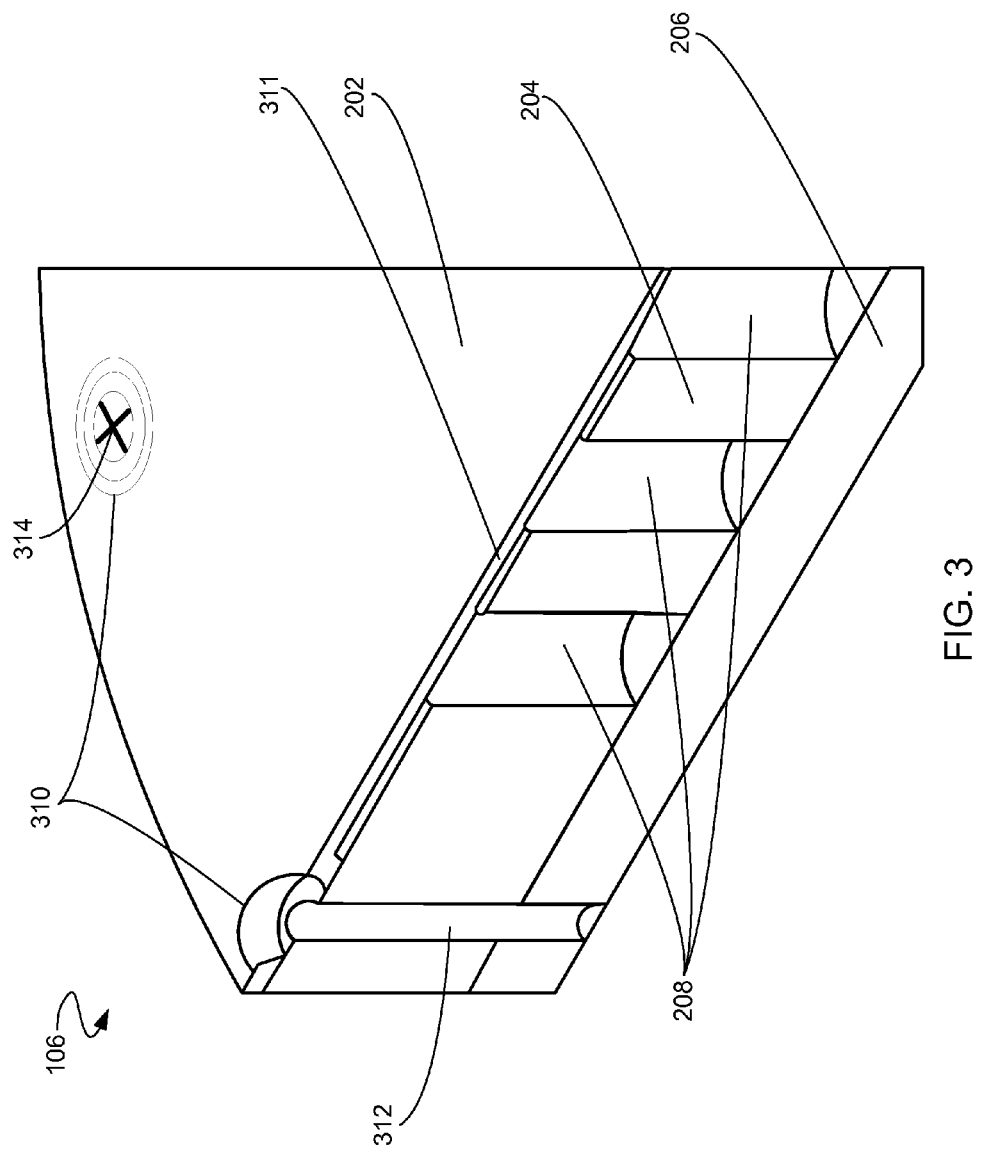
FIG. 3 is a perspective cross sectional portion of an exemplary programmable magnet pack, according to an embodiment of the present invention.

FIG. 3 is a perspective cross sectional view of a portion of the programmable magnet pack 106, according to an embodiment of the present invention. The programmable magnet pack 106 is depicted as partially assembled. In an embodiment, the cover 202 is removably connected to the template 204 via a fastener 314 that is inserted into a fastener hole 310 located on the cover 202. In various embodiments, a cylinder 312 may extend through the template 204 and yoke 206. The cylinder 312 allows for the fastener 314 inserted into the fastener hole 310 to extend through the template 204 and yoke 206, allowing for the cover 202, template 204, and yoke 206 to be removably connected together via the fastener 314.

In another embodiment, the various removable inserts 418 (see FIG. 4A) may be longer than the height of the cells 208 and may physically touch the cover 202 when disposed within a cell 208. The cover 202 has an additional thickness 311 to account for any removable inserts 418 (see FIG. 4A) disposed within cells 208 that may be longer than the height of the cell 208. The additional thickness 311 allows for the cover 202 to be removably connected to the template 204 via the fastener 314 that is inserted into the fastener hole 310 when at least one removable inserts 418 (see FIG. 4A) is longer than the height of the cell 208.

FIG. 4A is a perspective view of various removable and interchangeable inserts 418 that may be used with the programmable magnet pack, according to an embodiment of the present invention. The removable and interchangeable inserts 418 may be full length magnetic inserts 420, half length magnetic inserts 426, full length non-magnetic inserts 428, or half-length non-magnetic inserts 430.

The full length magnetic inserts 420 and half length magnetic inserts 426 may have a first polarity and second polarity, typically a north pole 422 and a south pole 424. The full length magnetic inserts 420 and the half length magnetic inserts 426 may comprise a permanent magnetic material, including but not limited to, Neodymium, Samaraium Cobalt, Ceramic, or Alnico. In one embodiment, the full length magnetic inserts 420 and half length magnetic inserts 426 may comprise Rare-Earth (Neodymium) Magnet Grade N52.

The full length non-magnetic inserts 428 and the half length non-magnetic inserts 430 may be made from various materials allowing a user to shunt the magnetic field or use as a counter weight for the purpose of rotation stability. Full length non-magnetic inserts 428 and the half length non-magnetic inserts 430 may comprise such materials as, but is not limited to, Stainless Steel, Aluminum, Copper, and Nylon. In one embodiment, the full length non-magnetic inserts 428 and the half length non-magnetic inserts 430 comprise Stainless Steel Grade 304 and Stainless Steel Grade 410.

Half length non-magnetic inserts 430 and half-length magnetic inserts 426 may be interposably stacked in a cell 208 (see FIG. 4B) on the template 204 (see FIG. 4B) to form a stacked insert 427. The stacked insert 427 may have either a half length non-magnetic insert 430 or a half length magnetic insert 426 facing the cover 202 (see FIG. 4B).

Figure 4B:
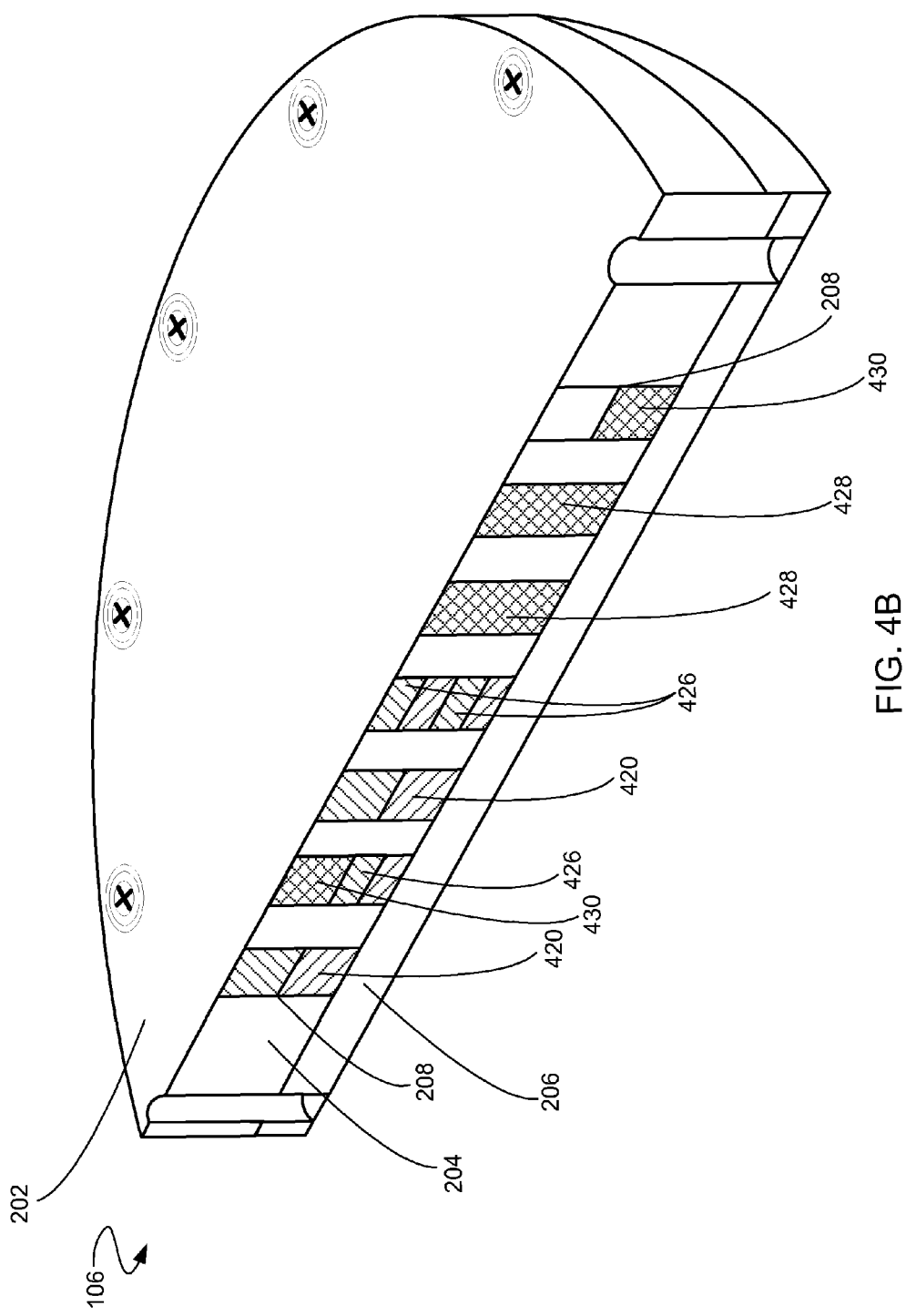
FIG. 4B is a perspective cross section of the programmable magnet pack with inserts inside cells on a template, according to an embodiment of the present invention.

FIG. 4B is a perspective cross sectional view of a portion of the programmable magnet pack 106 with removable and interchangeable inserts 418 (FIG. 4A) inside of cells 208 on the template 204, according to an embodiment of the present invention. The programmable magnet pack 106 is assembled.

Each full length magnetic insert 420 and each half length magnetic insert 426 may be placed within a cell 208 with either its north pole 422 (FIG. 4A) closest to the cover 202 or its south pole 424 (FIG. 4A) closest to the cover 202. Any number of removable and interchangeable inserts 418 (FIG. 4A) may be placed in each cell 208 to obtain a desired erosion profile and desired sputtering performance. The maximum number of removable and interchangeable inserts 418 (FIG. 4A) placed in a cell 208 is limited by the thickness of the template 204. There are a number of possible removable and interchangeable insert arrangements 418 (FIG. 4A). For example, in one embodiment, a cell 208 may be stacked with X number of full length magnetic inserts 420 or half length magnetic inserts 426. Each full length magnetic insert 420 or half length magnetic insert 426 may have either its north pole 422 (FIG. 4A) or south pole 424 (FIG. 4A) facing the cover 202.

In another embodiment, a cell 208 may be stacked with X number of full length non-magnetic inserts 428 or half length non-magnetic inserts 430. In another embodiment, a cell 208 may be stacked with Y number of full length non-magnetic inserts 428 or half length non-magnetic inserts 430 closest to the yoke 206, and with full length magnetic inserts 420 or half length magnetic inserts 426 in the remaining portion of the cell 208. In another embodiment, a cell 208 may be stacked with Y number of full length non-magnetic inserts 428 or half length non-magnetic inserts 430 closest to the cover 202, and with full length magnetic inserts 420 or half length magnetic inserts 426 in the remaining portion of the cell 208.

Magnetic inserts 420, 426 and non-magnetic inserts 428, 430 may also be interposed in any number of configurations inside each cell 208. While these embodiments serve as examples, the number of possible configurations is much greater.

FIG. 5A depicts an exemplary template 204 having a plurality of circular cells 532, according to an embodiment of the present invention. Removable and interchangeable inserts 418 (FIG. 4A) with a circular shape can be placed inside of the circular cells 532 on the template 204. For example, magnetic inserts 420, 426 (FIG. 4A) and non-magnetic inserts 428, 430 (FIG. 4A) having a circular shape can be placed inside of the circular cells 532 on the template 204.

FIG. 5B depicts an exemplary template 204 having a plurality of diamond shaped cells 534, according to an embodiment of the present invention. Removable and interchangeable inserts 418 (FIG. 4A) with a diamond shape can be placed inside of the diamond shaped cells 534 on the template 204. For example, magnetic inserts 420, 426 (FIG. 4A) and non-magnetic inserts 428, 430 (FIG. 4A) having a diamond shape can be placed inside of the diamond shaped cells 534 on the template 204.

FIG. 5C depicts an exemplary template 204 having a plurality of hex shaped cells 536, according to an embodiment of the present invention. Removable and interchangeable inserts 418 (FIG. 4A) with a hex shape can be placed inside of the hex shaped cells 536 on the template 204. For example, magnetic inserts 420, 426 (FIG. 4A) and non-magnetic inserts 428, 430 (FIG. 4A) having a hex shape can be placed inside of the hex shaped cells 536 on the template 204.

FIG. 5D depicts an exemplary template 204 having a plurality of square shaped cells 538 according to an embodiment of the present invention. Removable and interchangeable inserts 418 (FIG. 4A) with a hex shape can be placed inside of the square shaped cells 538 on the template 204. For example, magnetic inserts 420, 426 (FIG. 4A) and non-magnetic inserts 428, 430 (FIG. 4A) having a square shape can be placed inside of the square shaped cells 538 on the template 204.

FIG. 5E depicts an exemplary template 204 having a plurality of triangular cells 540, according to an embodiment of the present invention. Removable and interchangeable inserts 418 (FIG. 4A) with a diamond shape can be placed inside of the diamond shaped cells 540 on the template 204. For example, magnetic inserts 420, 426 (FIG. 4A) and non-magnetic inserts 428, 430 having a triangular shape can be placed inside of the triangular shaped cells 540 on the template 204.

Figure 6:
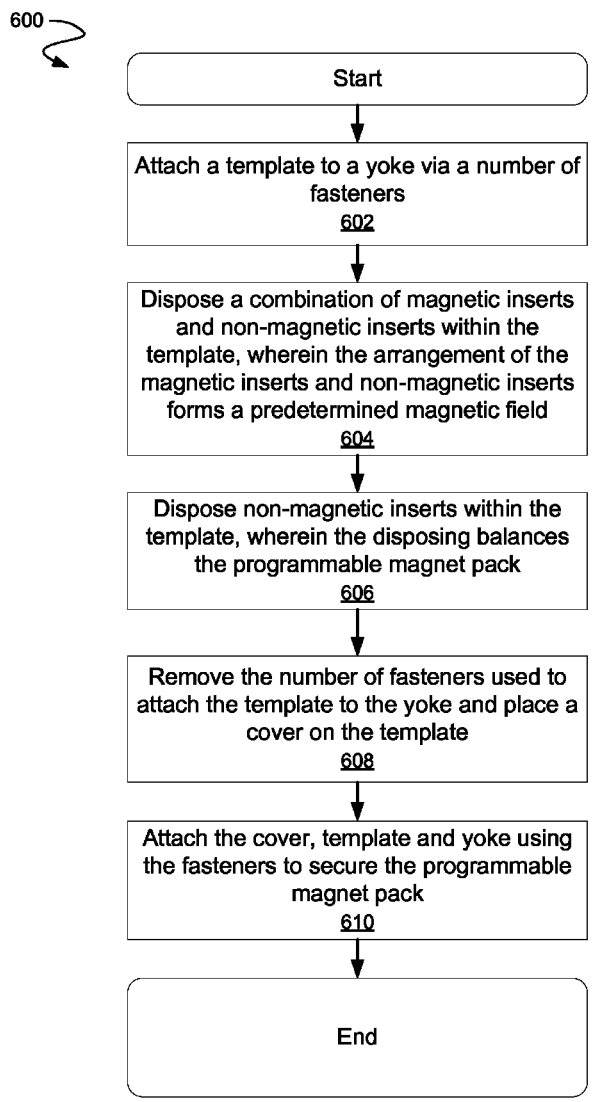
FIG. 6 depicts a flowchart of an exemplary process of preparing a programmable magnet pack, according to some embodiments of the present invention.

FIG. 6 depicts a flowchart 600 of an exemplary process of preparing a programmable magnet pack according to some embodiments of the present invention. In a block 602, a template is attached to a yoke via a number of fasteners. In some embodiments, the template may include a number of cells.

For example, FIG. 3 depicts a yoke attached to a second side of the template. In some embodiments, the yoke is operable to provide a return path for a magnetic field generated by the number of magnetic inserts and the number of non-magnetic inserts. For example, the yoke provides a return path for a magnetic field that is customized or shaped by the various removable inserts within the cells on the template.

In a block 604, a combination of magnetic inserts and non-magnetic inserts are disposed within the template. The arrangement of the magnetic inserts and non-magnetic inserts forms a predetermined magnetic field. For example, FIG. 4B depicts full length non-magnetic inserts, half length non-magnetic inserts, full length magnetic inserts, and half length magnetic inserts disposed within cells on a template.

In some embodiments, the non-magnetic inserts include a full length non-magnetic insert comprising Aluminum, Nylon, or Stainless Steel. Furthermore, the non-magnetic inserts may comprise half length non-magnetic insert including Aluminum, Nylon, or Stainless Steel. For example, full length non-magnetic inserts and half length non-magnetic inserts may include Aluminum, Nylon, or Stainless Steel.

In further embodiments, the magnetic inserts include full length magnetic inserts comprising Neodymium, Samarium Cobalt, Ceramic, Alnico, Stainless Steel, or Steel. Furthermore, the magnetic inserts may comprise half length magnetic inserts including Neodymium, Samarium Cobalt, Ceramic, Alnico, Stainless Steel, or Steel. For example, full length magnetic inserts and half length magnetic inserts may comprise Neodymium, Samarium Cobalt, Ceramic, Alnico, Stainless Steel, or Steel.

In further embodiments, the number of magnetic inserts and number of non-magnetic inserts are variably stacked in the cells, wherein the number of magnetic inserts and number of non-magnetic inserts are operable to customize or shape a magnetic field over a target and surrounding a plurality of cells. For example, in FIG. 4B the full length magnetic inserts, half length magnetic inserts, full length non-magnetic inserts, and half length non-magnetic inserts are variably stacked in cells on a template.

In a further example, in FIG. 4B, a cell may be stacked with X number of full length magnetic inserts or half length magnetic inserts. Each full length magnetic insert or half length magnetic insert may have either its north pole or south pole 424 facing the cover. In another embodiment, a cell may be stacked with X number of full length non-magnetic inserts or half length non-magnetic inserts. In another embodiment, a cell may be stacked with Y number of full length non-magnetic inserts or half length non-magnetic inserts closest to the yoke, and with full length magnetic inserts or half length magnetic inserts in the remaining portion of the cell.

In another embodiment, a cell may be stacked with Y number of full length non-magnetic inserts or half length non-magnetic inserts closest to the cover, and with full length magnetic inserts or half length magnetic inserts in the remaining portion of the cell.

In further embodiments, the cells on the template include a number of circular cells, a number of triangular cells, a number of square cells, a number of diamond shaped cells, or a number of hex shaped cells. For example, FIGS. 5A-5E depict templates having a number of circular cells, triangular cells, square cells, diamond shaped cells, and hex shaped cells. The inserts have corresponding shapes and may be selectively arranged within respectively shaped cells. Further, the various shapes of inserts are interchangeable to correspond to various shaped cells, allowing for various combinations of inserts and cells.

In a block 606, non-magnetic inserts are disposed within the template to balance the programmable magnet pack. For example, FIG. 4B depicts full length non-magnetic inserts and half length non-magnetic inserts disposed within cells on a template.

In some embodiments, the non-magnetic inserts include a full length non-magnetic insert comprising Aluminum, Nylon, or Stainless Steel. Furthermore, the non-magnetic inserts may comprise half length non-magnetic insert including Aluminum, Nylon, or Stainless Steel. For example, full length non-magnetic inserts and half length non-magnetic inserts may include Aluminum, Nylon, or Stainless Steel.

In further embodiments, the number of non-magnetic inserts are variably stacked in the cells, wherein the number of non-magnetic inserts are operable to balance and distribute the weight of other removable inserts disposed within the programmable magnet pack. For example, in FIG. 4B the full length magnetic inserts, half length magnetic inserts, full length non-magnetic inserts, and half length non-magnetic inserts are variably stacked in cells on a template.

In a block 608, the number of fasteners used to attach the template to the yoke is removed and a cover is placed on the template. For example, FIG. 4B depicts a cover placed on a first side of the template. In further embodiments, the cover protects the number of magnetic inserts and number of non-magnetic inserts. For example, in FIG. 4B, the cover protects the various removable inserts within the cells on the template from damage and also allows for the various removable inserts to come as close to the target as possible.

In a block 610, the cover, template, and yoke are attached using the fasteners in order to secure the programmable magnet pack. For example, FIG. 4B depicts a cover attached to a first side of the template with Phillips head screws. In further embodiments, the securing protects the number of magnetic inserts and number of non-magnetic inserts. For example, in FIG. 4B, the cover protects the various removable inserts within the cells on the template from damage and also allows for the various removable inserts to come as close to the target as possible.

In further embodiments, a yoke is attached to a second side of the template. For example, FIG. 3 depicts a yoke attached to a second side of the template. In some embodiments, the yoke is operable to provide a return path for a magnetic field generated by the number of magnetic inserts and the number of non-magnetic inserts. For example, the yoke provides a return path for a magnetic field that is customized or shaped by the various removable inserts within the cells on the template.

Figure 7:
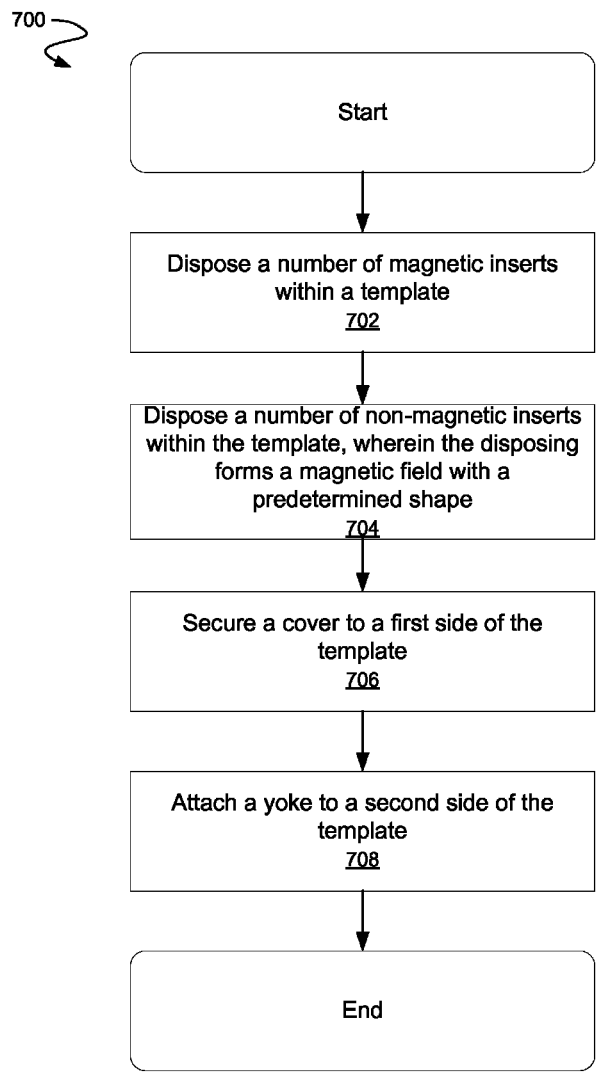
FIG. 7 depicts a flowchart of another exemplary process of preparing a programmable magnet pack, according to some embodiments of the present invention.

FIG. 7 depicts a flowchart 700 of another exemplary process of preparing a programmable magnet pack according to some embodiments of the present invention. In a block 702, a number of magnetic inserts are disposed within a template. In some embodiments, the template may include a number of cells, a cover removably connected with a first side of the template, and a yoke removably connected with a second side of the template. In further embodiments, the number of magnetic inserts are disposed within the number of cells on the template. For example, FIG. 4B depicts full length magnetic inserts and half length magnetic inserts disposed within cells on a template, the template having a cover connected with its first side and a yoke connected with its second side.

In further embodiments, the magnetic inserts include full length magnetic inserts comprising Neodymium, Samarium Cobalt, Ceramic, Alnico, Stainless Steel, or Steel. Furthermore, the magnetic inserts may comprise half length magnetic inserts including Neodymium, Samarium Cobalt, Ceramic, Alnico, Stainless Steel, or Steel. For example, full length magnetic inserts and half length magnetic inserts may comprise Neodymium, Samarium Cobalt, Ceramic, Alnico, Stainless Steel, or Steel.

In a block 704, a number of non-magnetic inserts are disposed within the template. For example, FIG. 4B depicts full length non-magnetic inserts and half length non-magnetic inserts disposed within cells on a template.

In some embodiments, the non-magnetic inserts include a full length non-magnetic insert comprising Aluminum, Nylon, or Stainless Steel. Furthermore, the non-magnetic inserts may comprise half length non-magnetic insert including Aluminum, Nylon, or Stainless Steel. For example, full length non-magnetic inserts and half length non-magnetic inserts may include Aluminum, Nylon, or Stainless Steel.

In further embodiments, the number of magnetic inserts and number of non-magnetic inserts are variably stacked in the cells, wherein the number of magnetic inserts and number of non-magnetic inserts are operable to customize or shape a magnetic field over a target and surrounding a plurality of cells. For example, in FIG. 4B the full length magnetic inserts, half length magnetic inserts, full length non-magnetic inserts, and half length non-magnetic inserts are variably stacked in cells on a template.

In a further example, in FIG. 4B, a cell may be stacked with X number of full length magnetic inserts or half length magnetic inserts. Each full length magnetic insert or half length magnetic insert may have either its north pole or south pole 424 facing the cover. In another embodiment, a cell may be stacked with X number of full length non-magnetic inserts or half length non-magnetic inserts. In another embodiment, a cell may be stacked with Y number of full length non-magnetic inserts or half length non-magnetic inserts closest to the yoke, and with full length magnetic inserts or half length magnetic inserts in the remaining portion of the cell.

In another embodiment, a cell may be stacked with Y number of full length non-magnetic inserts or half length non-magnetic inserts closest to the cover, and with full length magnetic inserts or half length magnetic inserts in the remaining portion of the cell.

In further embodiments, the cells on the template include a number of circular cells, a number of triangular cells, a number of square cells, a number of diamond shaped cells, or a number of hex shaped cells. For example, FIGS. 5A-5E depict templates having a number of circular cells, triangular cells, square cells, diamond shaped cells, and hex shaped cells. The inserts have corresponding shapes and may be selectively arranged within respectively shaped cells. Further, the various shapes of inserts are interchangeable to correspond to various shaped cells, allowing for various combinations of inserts and cells.

In a block 706, a cover is secured to a first side of the template. In some embodiments, the securing includes securing the cover to the first of the template with a removable fastener. For example, FIG. 4B depicts a cover attached to a first side of the template with Phillips head screws. In further embodiments, the securing protects the number of magnetic inserts and number of non-magnetic inserts. For example, in FIG. 4B, the cover protects the various removable inserts within the cells on the template from damage and also allows for the various removable inserts to come as close to the target as possible.

In a block 708, a yoke is attached to a second side of the template. For example, FIG. 3 depicts a yoke attached to a second side of the template. In some embodiments, the yoke is operable to provide a return path for a magnetic field generated by the number of magnetic inserts and the number of non-magnetic inserts. For example, the yoke provides a return path for a magnetic field that is customized or shaped by the various removable inserts within the cells on the template.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

What is claimed is:

1. An apparatus, comprising:
    a target positioned opposite a substrate;
    a template comprising a plurality of cells;
    a plurality of removable inserts disposed within the plurality of cells, wherein
        the plurality of removable inserts comprises full cell length magnetic inserts, half cell length magnetic inserts, full cell length non-magnetic inserts, and half cell length non-magnetic inserts,
        one cell of the plurality of cells comprises a full cell length non-magnetic insert,
        another cell of the plurality of cells comprises one of the half cell length magnetic inserts and one of the half cell length non-magnetic inserts and
        the plurality of removable inserts is configured to be rearranged and inserted into different cells of the plurality of cells to alter performance of a sputtering apparatus;
    a cover removably connected with a first side of the template configured to conceal the plurality of removable inserts, wherein the cover is configured to be positioned proximate to the target; and a yoke removably connected with a second side of the template, wherein the template, the cover, and the yoke secure the plurality of removable inserts.

2. The apparatus of claim 1, wherein:
the cover comprises an additional thickness configured to account for one or more removable inserts of the plurality of removable inserts having a height that is greater than a height of its corresponding cell.

3. The apparatus of claim 1, wherein the full cell length magnetic inserts and half cell length magnetic inserts are selected from a group consisting of Neodymium, Samarium Cobalt, Ceramic, Alnico, Stainless Steel, and Steel.

4. The apparatus of claim 1, wherein the full cell length non-magnetic inserts and half cell length non-magnetic inserts are selected from a group consisting of Aluminum, Nylon, and Stainless Steel configured to balance the weight of the plurality of removable inserts.

5. The apparatus of claim 1, wherein the removable inserts are variably stacked in corresponding cells such that a cell associated with the full cell length non-magnetic insert is located adjacent to a cell associated with the full cell length or half cell length magnetic insert, and wherein further the full cell length or half cell length magnetic insert and the full cell length non-magnetic insert are operable to shape a magnetic field over a target.

6. The apparatus of claim 1, wherein the yoke is operable to provide a return path for a magnetic field generated by the plurality of removable inserts.

7. The apparatus of claim 1, wherein cells of the plurality of cells are selected from a group consisting of a plurality of circular cells, a plurality of triangular cells, a plurality of square cells, a plurality of diamond shaped cells, and a plurality of hex shaped cells.

8. An apparatus, comprising:
a target positioned opposite a substrate;
a plurality of cells;
a plurality of interchangeable magnetic inserts arranged within the plurality of cells;
a plurality of interchangeable non-magnetic inserts arranged within the plurality of cells,
wherein the plurality of interchangeable magnetic inserts and the plurality of interchangeable non-magnetic inserts are operable to be rearranged and inserted into different cells of the plurality of cells to reconfigure magnetic fields surrounding the plurality of cells,
wherein the plurality of interchangeable magnetic inserts comprises lengths that are longer than a cell length, half of the cell length, and equal to the cell length,
wherein the plurality of interchangeable non-magnetic inserts comprises lengths that are longer than the cell length, half of the cell length, and equal to the cell length,
wherein one cell of the plurality of cells includes one of the plurality of non-magnetic inserts equal to the cell length, and
wherein another cell of the plurality of cells includes a half cell length magnetic insert and a half cell length non-magnetic insert; and
a cover overlying the plurality of cells, wherein the cover is configured to conceal the plurality of interchangeable magnetic inserts and the plurality of interchangeable non-magnetic inserts, wherein the cover is configured to be positioned proximate to the target, wherein the cover and a yoke secure the plurality of interchangeable magnetic inserts and the plurality of interchangeable non-magnetic inserts.

9. The apparatus of claim 8, wherein:
the plurality of interchangeable magnetic inserts is selected from a group consisting of a permanent magnet material, Stainless Steel, or a Steel material; and
the plurality of interchangeable non-magnetic inserts is selected from a group consisting of Aluminum, Nylon, and Stainless Steel, wherein the selection is configured to balance the weight of the plurality of interchangeable magnetic and non-magnetic inserts.

10. The apparatus of claim 8, wherein the cover comprises an additional thickness wherein the additional thickness is configured to account for one or more inserts of the plurality of interchangeable magnetic inserts or the plurality of interchangeable non-magnetic inserts having a height that is greater than a height of its corresponding cell, and wherein the cover is operable to protect the plurality of interchangeable magnetic inserts and the plurality of interchangeable non-magnetic inserts.

11. The apparatus of claim 8, wherein the plurality of interchangeable magnetic inserts and the plurality of interchangeable non-magnetic inserts are variably stacked in the plurality of cells.

12. The apparatus of claim 11, wherein a yoke is operable to provide a magnetic field return path configured by the plurality of interchangeable magnetic inserts and the plurality of interchangeable non-magnetic inserts.

13. The apparatus of claim 8, wherein the plurality of cells comprises a plurality of closed form shapes.

14. An apparatus, comprising:
a target positioned opposite a substrate;
a template comprising a plurality of removable magnetic inserts and a plurality of removable non-magnetic inserts, wherein the plurality of removable magnetic inserts and the plurality of removable non-magnetic inserts are configured to be rearranged to reconfigure a magnetic field over the target, wherein
the plurality of removable magnetic inserts comprises a full cell length magnet and a half cell length magnet,
the plurality of removable non-magnetic inserts comprises a full cell length non-magnetic insert and a half cell length non-magnetic insert, and
one removable non-magnetic insert of the plurality of removable non-magnetic inserts and one magnetic insert of the plurality of magnetic inserts are of different lengths and are stacked on each other;
a cover removably connected with a first side of the template configured to conceal the plurality of removable magnetic inserts and the plurality of removable non-magnetic inserts, wherein the cover is configured to be positioned proximate to the target; and
a yoke removably connected with a second side of the template, wherein the cover and the yoke secure the plurality of removable magnetic inserts and the plurality of removable non-magnetic inserts.

15. The apparatus of claim 14, wherein the cover comprises an additional thickness configured to account for one or more removable magnetic inserts of the plurality of removable magnetic inserts or the plurality of removable non-magnetic inserts having a height that is greater than a height of its corresponding cell, and wherein the cover is secured to the first side of the template with a removable fastener.

16. The apparatus of claim 14, wherein the yoke is operable to provide a return path for the magnetic field.

17. The apparatus of claim 14, wherein the plurality of removable magnetic inserts and the plurality of removable non-magnetic inserts are variably stacked in the template.

18. The apparatus of claim 14, wherein:
the full cell length non-magnetic insert is located adjacent to the full cell length magnet or the half cell length magnet.

19. The apparatus of claim 14, wherein:
the plurality of removable magnetic inserts is selected from a group consisting of a permanent magnet material, Stainless Steel, and a Steel material; and
the plurality of removable non-magnetic inserts is selected from a group consisting of Aluminum, Nylon, and Stainless Steel configured to balance the weight of the removable magnetic and non-magnetic inserts.

* * * * *